(12) United States Patent
Kim et al.

(10) Patent No.: US 8,979,462 B2
(45) Date of Patent: Mar. 17, 2015

(54) SUBSTRATE-PROCESSING APPARATUS AND METHOD OF TRANSFERRING SUBSTRATE IN THE SAME

(75) Inventors: Kyung Mo Kim, Chungcheongnam-do (KR); Sang-Seok Hong, Chungcheongnam-do (KR)

(73) Assignee: Semes Co., Ltd., Chungcheongnam-do (KR)

( * ) Notice: Subject to any disclaimer, the term of this patent is extended or adjusted under 35 U.S.C. 154(b) by 947 days.

(21) Appl. No.: 13/056,397

(22) PCT Filed: Apr. 9, 2009

(86) PCT No.: PCT/KR2009/001836
§ 371 (c)(1),
(2), (4) Date: Jan. 28, 2011

(87) PCT Pub. No.: WO2010/016650
PCT Pub. Date: Feb. 11, 2010

(65) Prior Publication Data
US 2011/0135428 A1    Jun. 9, 2011

(30) Foreign Application Priority Data

Aug. 6, 2008    (KR) .................. 10-2008-0077103

(51) Int. Cl.
*H01L 21/677* (2006.01)
(52) U.S. Cl.
CPC .............................. *H01L 21/67781* (2013.01)
USPC .................. 414/217; 414/222.07; 414/805
(58) Field of Classification Search
USPC ............. 414/222.07, 217, 805, 806, 939
See application file for complete search history.

(56) References Cited

U.S. PATENT DOCUMENTS

| | | | |
|---|---|---|---|
| 8,146,530 B2* | 4/2012 | Ishikawa et al. | 118/503 |
| 2006/0182533 A1* | 8/2006 | Ogi | 414/217 |
| 2007/0190246 A1* | 8/2007 | Otsuka et al. | 427/240 |
| 2008/0166208 A1* | 7/2008 | Lester et al. | 414/217 |
| 2008/0187413 A1* | 8/2008 | Kondoh | 414/217 |
| 2008/0304952 A1* | 12/2008 | Kondoh et al. | 414/805 |
| 2010/0172720 A1* | 7/2010 | Kondoh | 414/217 |
| 2011/0178631 A1* | 7/2011 | Kondoh et al. | 700/218 |

FOREIGN PATENT DOCUMENTS

| | | |
|---|---|---|
| JP | 11-330037 A | 11/1999 |
| JP | 2001-358192 A | 12/2001 |

(Continued)

OTHER PUBLICATIONS

International Search Report for Appl. No. PCT/KR2009/001836 mailed Nov. 26, 2009.

*Primary Examiner* — Saul Rodriguez
*Assistant Examiner* — Gabriela Puig
(74) *Attorney, Agent, or Firm* — Carter, DeLuca, Farrell & Schmidt, LLP

(57) ABSTRACT

A substrate-processing apparatus includes a plurality of process chambers, a buffer unit, and a transfer member. The transfer member transfers the substrate between the process chambers and the buffer unit, and collects the substrates processed in at least two of the process chambers where processes are simultaneously finished to transfer the processed substrates to the buffer unit at once. Accordingly, a number of times during which the transfer member transfers substrates is decreased so that the substrate-processing apparatus reduces the process time and improves the productivity.

16 Claims, 7 Drawing Sheets

(56) References Cited

FOREIGN PATENT DOCUMENTS

| JP | 2003-037107 | 2/2003 |
| JP | 2003-309166 A | 10/2003 |
| KR | 1020050104491 A | 11/2005 |
| KR | 1020070095098 A | 9/2007 |

* cited by examiner

SUBSTRATE-PROCESSING APPARATUS AND METHOD OF TRANSFERRING SUBSTRATE IN THE SAME

TECHNICAL FIELD

The present invention disclosed herein relates to an apparatus manufacturing a semiconductor substrate, and more particularly, to a substrate-processing apparatus processing a semiconductor substrate and a method of transferring the substrate in the substrate-processing apparatus.

BACKGROUND ART

In substrate-manufacturing processes, deposition and etching of dielectrics and metal materials, coating and development of photoresists, asher process, etc are repeated a plurality of times to achieve delicate arrangement of patterning. However, although these processes including the etching or the asher process are performed, foreign substances still remain in substrates. Processes for removing these foreign substances include a cleaning process using deionized water or chemical.

Substrate-cleaning apparatuses performing the cleaning process are classified into a batch substrate cleaning apparatus and a single substrate cleaning apparatus. The batch substrate cleaning apparatus includes a chemical bath, a rinse bath, and a dry bath having sizes capable of processing 25 substrates or 50 substrates at once. The batch substrate cleaning apparatus removes foreign substances by immersing substrates in the respective baths for predetermined times. Such a batch substrate cleaning apparatus simultaneously cleans upper and lower portions of a substrate and processes a large amount of substrates simultaneously. However, as the diameters of substrates are increased, the sizes of baths are also increased, so as to increase the size of an apparatus and the amount of chemical. In addition, foreign substances detached from adjacent substrates are attached to substrates being cleaned in a chemical bath.

Recently, as the diameter of substrates is increased, the single substrate cleaning apparatus is widely used. In the single substrate cleaning apparatus, a substrate is fixed to a substrate chuck in a chamber having a small size adapted for processing a single substrate, then rotated by a motor, and then chemical or deionized water is provided to the substrate through a nozzle disposed over the substrate. The spin of the substrate spreads the chemical or the deionized water on the upper portion of the substrate, so as to remove foreign substances from the substrate. The single substrate cleaning apparatus has a smaller size than the batch substrate cleaning apparatus and achieves a uniform cleaning performance.

In general, the single substrate cleaning apparatus includes, from a side thereof, a loading/unloading unit, an index robot, a buffer unit, process chambers, and a main transfer robot. The index robot transfers substrates between the buffer unit and the loading/unloading unit, and the main transfer robot transfers substrates between the buffer unit and the process chambers. At the buffer unit, substrates to be cleaned wait to be inserted into the process chambers, or the substrates that have been cleaned wait to be transferred to the loading/unloading unit.

The main transfer robot includes a hand transferring a substrate to be cleaned and a hand transferring a cleaned substrate, so that the main transfer robot can transfers one substrate to be cleaned and one cleaned substrate. Thus, when substrates have been cleaned in the two process chambers, respectively, an operation of transferring the substrate to be cleaned from the buffer unit to the process chamber is performed two times, and an operation of transferring the cleaned substrate from the process chamber to the buffer unit is performed two times.

As such, the main transfer robot has two hands used for different purposes, and thus the main transfer robot transfers substrates between only one process chamber and the buffer unit, at a time. This increases the number of times during which the main transfer robot moves, and the transfer time of substrates, and reduces productivity.

DISCLOSURE OF INVENTION

Technical Problem

The present invention provides a substrate-processing apparatus improving efficiency in loading and unloading a substrate.

The present invention also provides a method of transferring a substrate in the substrate-processing apparatus.

Technical Solution

Embodiments of the present invention provide substrate-processing apparatuses including a plurality of process chambers, a buffer unit, and a transfer member.

A substrate is processed in each of the process chambers. The buffer unit stores the substrate to be loaded in the process chambers, and the substrate processed in the process chambers. The transfer member includes a plurality of horizontally movable pick-up hands, and the substrates are respectively placed on the pick-up hands, The transfer member transfers the substrate between the process chambers and the buffer unit, and collects the substrates processed in at least two of the process chambers where processes are simultaneously finished, to transfer the processed substrates to the buffer unit at once.

In some embodiments, the pick-up hands may be spaced apart from each other in a vertical direction to face each other, and each pick-up hand may be spaced apart from one or more adjacent ones of the pick-up hands at a first distance. The buffer unit may include a plurality of supports spaced apart in the vertical direction, and the respective supports may support an end of the substrate, and at least two of the supports, sequentially disposed in the vertical direction may be spaced the first distance.

In other embodiments of the present invention, methods of transferring a substrate include: taking out the substrate to be processed from a buffer unit by a transfer member to provide the substrate to a plurality of process chambers where the substrate is processed; taking out the processed substrate from the process chamber by the transfer member; and loading the processed substrate to the buffer unit by the transfer member.

The transfer member collects substrates processed in at least two of the process chambers where processes are simultaneously finished and transfers the processed substrates to the buffer unit at once.

In some embodiments, the transfer member may load at least one of the processed substrates into the buffer unit at a time.

Advantageous Effects

According to the present invention, the transfer member takes out processed substrates from the process chambers where processes are simultaneously finished, and transfers the processed substrates to the buffer unit at once. Accordingly, the number of times, during which the transfer member moves, is reduced, so that the substrate-processing apparatus reduces the process time and improves the productivity.

BRIEF DESCRIPTION OF DRAWINGS

The accompanying figures are included to provide a further understanding of the present invention, and are incorporated in and constitute a part of this specification. The drawings illustrate exemplary embodiments of the present invention and, together with the description, serve to explain principles of the present invention. In the figures.

MODE FOR THE INVENTION

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

Hereinafter, it will be described about an exemplary embodiment of the present invention in conjunction with the accompanying drawings.

Figure 1:
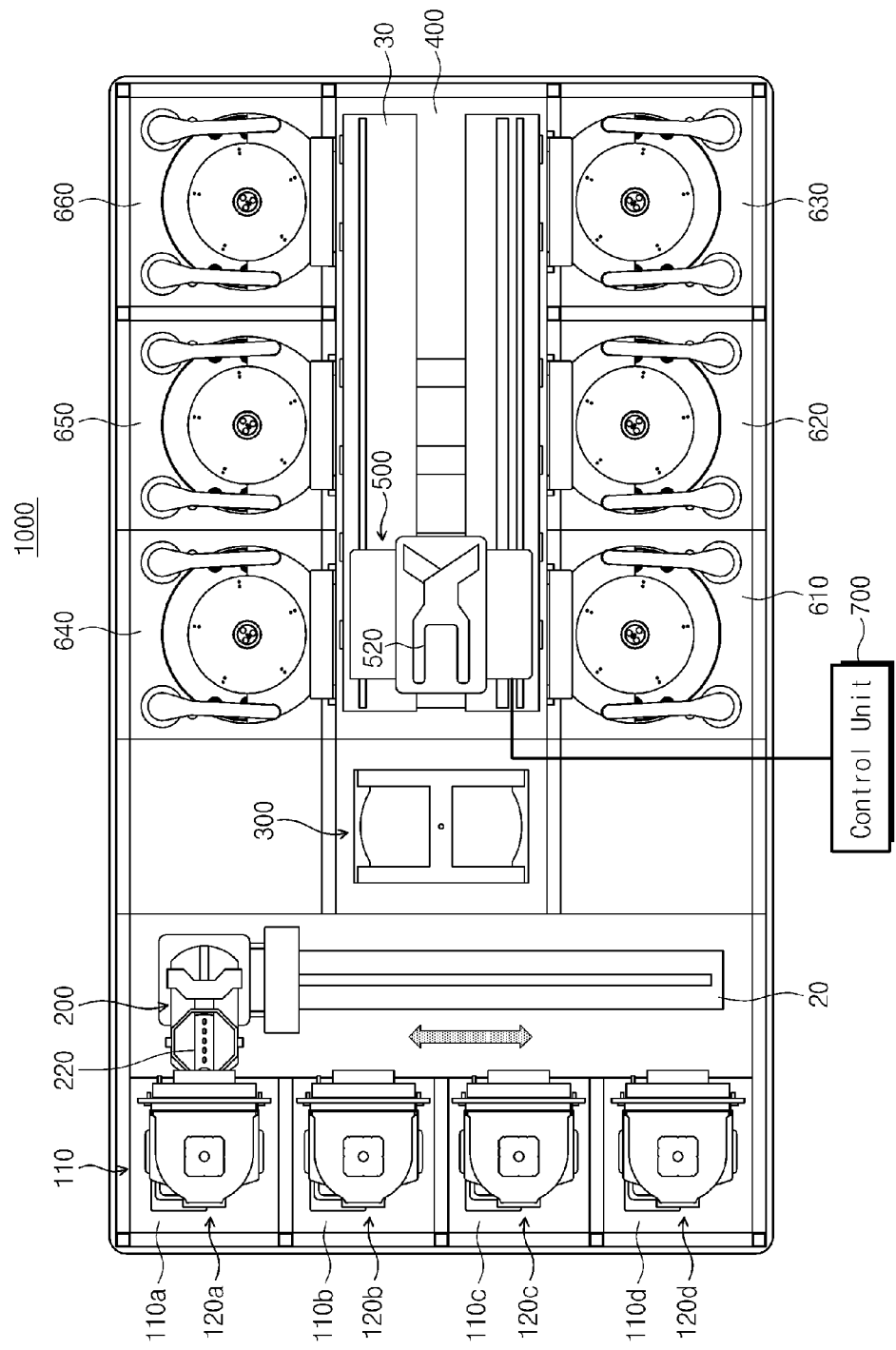
FIG. 1 is a schematic view illustrating a substrate-processing system according to an embodiment of the present invention.

FIG. 1 is a schematic view illustrating a substrate-processing system 1000 according to an embodiment of the present invention.

Referring to FIG. 1, the substrate-processing system 1000 may include a loading/unloading unit 110, an index robot 200, a buffer unit 300, a main transfer robot 500, a plurality of process chambers 610, 620, 630, 640, 650, and 660, and a control unit 700.

The loading/unloading unit 110 includes a plurality of load ports 110a, 110b, 110c, and 110d. Although the loading/unloading unit 110 includes the four load ports 110a, 110b, 110c, and 110d in this embodiment, the number of the load ports 110a, 110b, 110c, and 110d may be increased or decreased according to process efficiency and footprint conditions of the substrate-processing system 1000.

Front open unified pods (FOUPs) 120a, 120b, 120c, and 120d are placed on the load ports 110a, 110b, 110c, and 110d. Wafers are stored in the FOUPs 120a, 120b, 120c, and 120d.

The respective FOUPs 120a, 120b, 120c, and 120d are provided with a plurality of slots for storing wafers horizontally to a ground. The FOUPs 120a, 120b, 120c, and 120d store wafers that was loaded and have been processed in the process chambers 610, 620, 630, 640, 650, and 660 or wafers that will be loaded and processed in the process chambers 610, 620, 630, 640, 650, and 660. Hereinafter, for convenience, wafers that have been processed by the substrate-processing system 1000 are referred to as processed wafers, and wafers that are not processed yet are referred to as primitive wafers.

The index robot 200 is disposed between the loading/unloading unit 110 and the buffer unit 300, and a first transfer rail 20 is disposed below the index robot 200. The index robot 200 includes a plurality of index arms 220 on which wafers are respectively loaded. The index robot 200 moves along the first transfer rail 20 and transfers wafers.

The index arms 220 can be driven independently, and pick up a primitive wafer from one of the FOUPs 120a, 120b, 120c, and 120d placed on any one of the load ports 110a, 110b, 110c, and 110d, and provides the primitive wafer to the buffer unit 300.

The index robot 200 picks up at least one primitive wafer at a time from the FOUPs 120a, 120b, 120c, and 120d. For example, the index robot 200 includes the four index arms 220 that are vertically arranged and parallel with each other, each of which picks up one wafer.

The index robot 200, using adjacent two of the four index arms 220, picks up simultaneously two primitive wafers from the corresponding one of the FOUPs 120a, 120b, 120c, and 120d. The index robot 200 may load a primitive wafer on the buffer unit 300, or may load a plurality of primitive wafers, simultaneously.

That is, the index robot 200 picks up two primitive wafers at a time from the FOUPs 120a, 120b, 120c, and 120d, and then simultaneously loads the two primitive wafers on the buffer unit 300. The number of primitive wafers simultaneously loaded by the index robot 200 on the buffer unit 300 depends on the number of primitive wafers simultaneously taken out from the FOUPs 120a, 120b, 120c, and 120d.

In the same manner, the index robot 200 picks up at least one processed wafer at a time from the buffer unit 300. That is, the index robot 200 simultaneously picks up two processed wafers from the buffer unit 300, and then simultaneously loads the picked-up two processed wafers on the corresponding one of the load ports 110a, 110b, 110c, and 110d.

While a process is performed, the number of wafers picked up or loaded at a time by the index robot 200 depends on the respective numbers of processed and primitive wafers that are currently loaded on the buffer unit 300.

The index arms 220 of the index robot 200 may be classified into arms transferring a primitive wafer and arms transferring a processed wafer. For example, lower two of the four index arms 220 may be used as the arms transferring a primitive wafer, and upper two of the four index arms 220 may be used as the arms transferring a processed wafer.

In this embodiment, when simultaneously processing a plurality of wafers, the index robot 200 picks up or loads the two wafers, but the number of wafers simultaneously picked up or loaded by the index robot 200 may be increased according to the number of index arms 220 provided to the index robot 200.

The buffer unit 300 is disposed between a region where the index robot 200 is disposed, and a region where the process chambers 610, 620, 630, 640, 650, and 660 and the main transfer robot 500 are disposed. The buffer unit 300 receives primitive wafers transferred by the index robot 200, and wafers processed at the process chambers 610, 620, 630, 640, 650, and 660.

Figure 2:
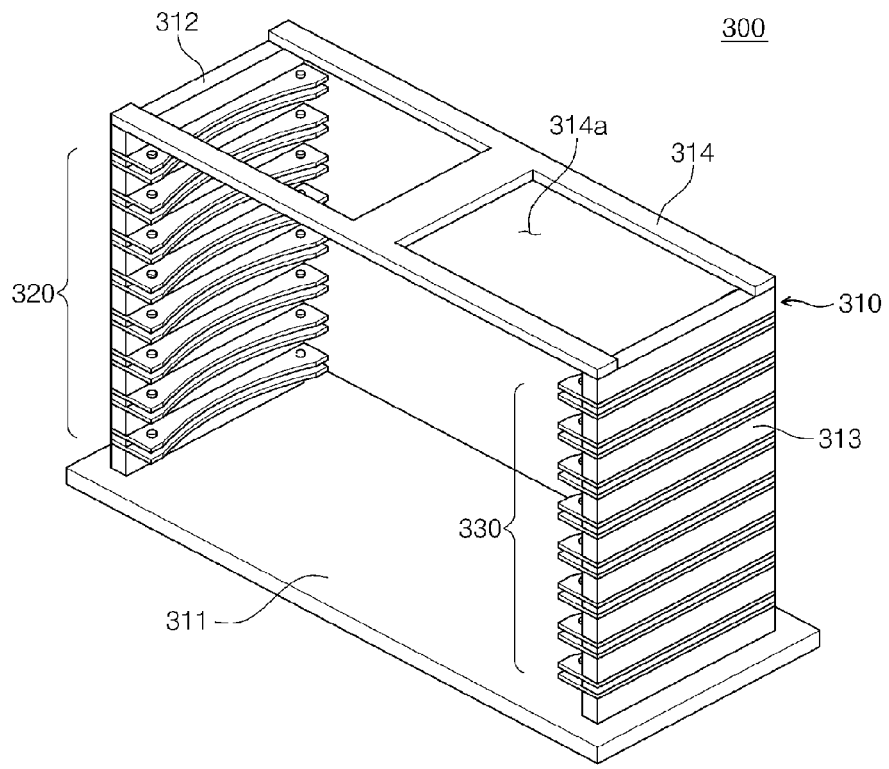
FIG. 2 is a perspective view of a buffer unit illustrated in FIG. 1.
Figure 3:
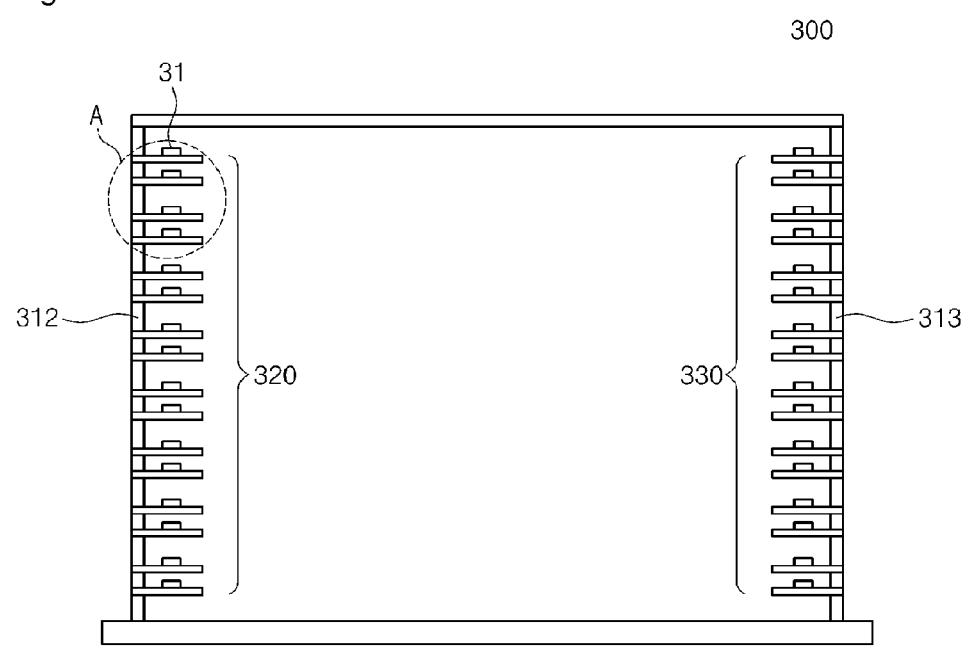
FIG. 3 is a side view of the buffer unit illustrated in FIG. 2.
Figure 4:
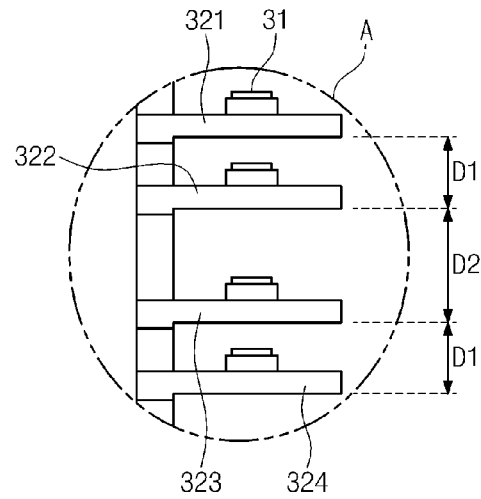
FIG. 4 is an enlarged view illustrating a portion 'A' of FIG. 3.

FIG. 2 is a perspective view of the buffer unit 300 illustrated in FIG. 1. FIG. 3 is a side view of the buffer unit 300 illustrated in FIG. 2. FIG. 4 is an enlarged view illustrating a portion 'A' of FIG. 3.

Referring to FIGS. 1 and 3, the buffer unit 300 includes a main body 310 and first and second support parts 320 and 330.

Particularly, the main body 310 may include a bottom surface 311, first and second sidewalls 312 and 313 extending vertically from the bottom surface 311, and an upper surface 314 coupled to upper ends of the first and second sidewalls 312 and 313.

For accessing with wafers, the main body 310 has an open front wall facing the index robot 200 and an open rear wall facing the main transfer robot 500. Accordingly, it is convenient for the index robot 200 and the main transfer robot 500 to insert and take out wafers into and from the buffer unit 300.

The first and second sidewalls 312 and 313 face each other, and the upper surface 314 is partially removed to have an opening 314a.

The first and second support parts 320 and 330 are disposed in the main body 310. The first support part 320 is coupled to the first sidewall 312, and the second support part 330 is coupled to the second sidewall 313. Each of the first and second support parts 320 and 330 includes a plurality of supports. The supports of the first support part 320 are in one-to-one correspondence to the supports of the second support part 330. Wafers are received by the buffer unit 300 with ends of the wafers supported by the supports of the first support part 320 and the supports of the second support part 330, in which the wafers face the bottom surface 311.

In this embodiment, the supports of the first support part 320 are the same in configuration as the supports of the second support part 330, and thus, the first support part 320 is exemplified to describe the configuration of the supports.

Referring to FIGS. 3 and 4, the supports of the first support part 320 are spaced vertically from each other, an adjacent couple of which may be spaced a first distance D1 or may be spaced a second distance D2 greater than the first distance D1, according to positions thereof. The first distance D1 is the same as gaps between the index arms 220 of the index robot 200 (refer to FIG. 1).

Particularly, the (2×N)th support of the first support part 320 (where N is a natural number that is at least one) is spaced the first distance D1 from the ((2×N)−1)th support, and spaced the second distance D2 from ((2×N)+1)th support.

That is, the even supports are spaced the first distance D1 from the odd supports disposed just above the even supports, respectively, and spaced the second distance D2 from the odd supports disposed just below the even supports, respectively.

For example, the first support 321 and the second support 322 of the first support part 320 are spaced the first distance D1 from each other, and the second support 322 is spaced the second distance D2 from the third support 323. The third support 323 is spaced the first distance D1 from the fourth support 324.

Hereinafter, for convenience, the supports spaced the first distance D1 and sequentially arranged are referred to as unit groups. In the first support part 320, the two unit groups adjacent to each other are spaced the second distance D2 from each other. That is, the first support 321 and the second support 322 form one unit group, and the third support 323 and the fourth support 324 form one unit group. Since the second support 322 is spaced the second distance D2 from third support 323, the distances between the adjacent unit groups is the second distance D2.

The first distance D1 between the supports in the unit group is set to be the same as the gaps between the index arms 220. Accordingly, the index robot 200 simultaneously picks up or loads two wafers in each of the unit groups from or to the buffer unit 300.

The gaps between the index arms 220 are set to be equal to a slot gap of the FOUPs 120a, 120b, 120c, and 120d (refer to FIG. 1). Thus, the index robot 200 simultaneously picks up or loads a plurality of wafers from or to the FOUPs 120a, 120b, 120c, and 120d.

Although the two supports of the first support part 320 form one unit group in this embodiment, the number of the supports forming one unit group may be increased according to the number of wafers loaded and picked up at a time to and from the buffer unit 300 by the index robot 200 and the main transfer robot 500, respectively.

Since the two adjacent unit groups are spaced the second distance D2 greater than the first distance D1, the index robot 200 and the main transfer robot 500 efficiently operate in the buffer unit 300.

As the distances D1 and D2 between the supports are decreased, possibility is increased that when the index arms 220 and pick-up hand part 520 pick up or load wafers and then move, the index arms 220 and the pick-up hand part 520 collide with wafers disposed in upper or lower portions. Wafers are loaded or picked up to or from the buffer unit 300 by the respective unit groups, and the unit groups are spaced the relatively wide second distance D2, thereby providing an enough space required for the index arms 220 and the pick-up hand part 520 of the main transfer robot 500 to move.

For example, the first distance D1 may be set to about 10 mm, and the second distance D2 may be set to about 20 mm.

The respective supports of the first and second support parts 320 and 330 may be provided with guide parts 31 guiding the positions of wafers. The guide parts 31 protrude from top surfaces of the supports and support side surfaces of wafers.

As described above, the distances D1 and D2 between the supports of the buffer unit 300, disposed sequentially are the same as those between the index arms 220 that simultaneously pick up or load wafers. Accordingly, the index robot 200 takes out and loads a plurality of wafers at a time from and to the buffer unit 300, thereby improving workability and productivity and reducing process time.

Referring again to FIG. 1, the main transfer robot 500 transfers primitive wafers disposed in the buffer unit 300 to the respective process chambers 610, 620, 630, 640, 650, and 660. The main transfer robot 500 is disposed at a transfer passage 400, and moves along a second transfer rail 30 disposed at the transfer passage 400. The transfer passage 400 is connected to the process chambers 610, 620, 630, 640, 650, and 660.

The main transfer robot 500 picks up primitive wafers from the buffer unit 300, and then moves along the second transfer rail 30 and provides the primitive wafers to the relevant one of the process chambers 610, 620, 630, 640, 650, and 660. Also, the main transfer robot 500 loads wafers processed in the process chambers 610, 620, 630, 640, 650, and 660 on the buffer unit 300.

Figure 5:
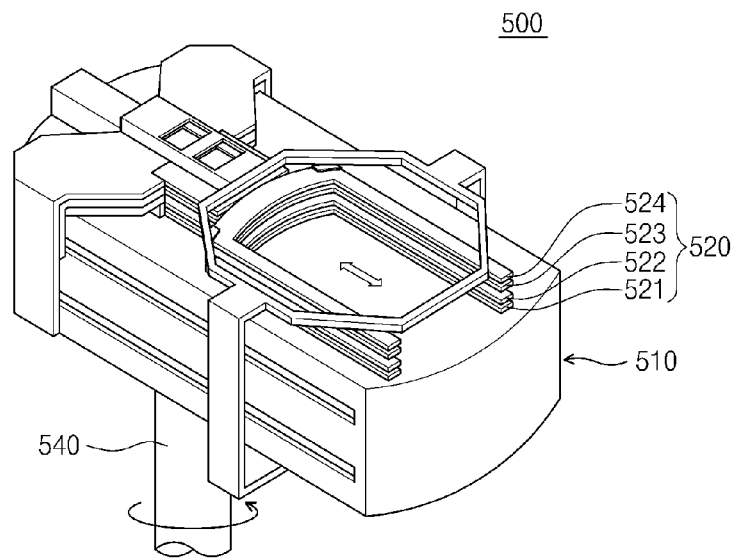
FIG. 5 is a perspective view of a main transfer robot illustrated in FIG. 1.

FIG. 5 is a perspective view of the main transfer robot 500 illustrated in FIG. 1.

Referring to FIGS. 1 and 5, the main transfer robot 500 may include a hand-driving part 510, the pick-up hand part 520, and a rotation part 540.

Particularly, the hand-driving part 510 moves respective pick-up hands 521, 522, 523, and 524 horizontally. The respective pick-up hands 521, 522, 523, and 524 are independently driven by the hand-driving part 510.

An upper portion of the hand-driving part 510 is provided with the pick-up hand part 520. The pick-up hands 521, 522, 523, and 524 face each other in the vertical direction, and a wafer is loaded on each of the pick-up hands 521, 522, 523, and 524. In this embodiment, the main transfer robot 500 is provided with the four pick-up hands 521, 522, 523, and 524, but the number of the pick-up hands 521, 522, 523, and 524 may be increased according to the process efficiency of the substrate-processing system 1000.

The pick-up hands 521 and 522 transferring primitive wafers may be referred to as load pick-up hands, and the pick-up hands 523 and 524 transferring processed wafers may be referred to as unload pick-up hands. In this case, the load pick-up hands 521 and 522 and the unload pick-up hands 523 and 524 are disposed separately, not alternately. For example, the unload pick-up hands 523 and 524 may be disposed over the load pick-up hands 521 and 522. Accordingly, the main transfer robot 500 prevents processed wafers from being contaminated by primitive wafers while transferring the primitive wafers and the processed wafers, thereby improving the yield of products.

The respective load pick-up hands 521 and 522 take out the primitive wafers from the buffer unit 300 and provide the processed wafers to the unemployed one of the process chambers 610, 620, 630, 640, 650, and 660. The load pick-up hands 521 and 522 are spaced the first distance D1 (refer to FIG. 4), like the supports in each of the unit groups in the buffer unit 300. Thus, the load pick-up hands 521 and 522 can take out simultaneously the primitive wafers from the buffer unit 300.

The respective unload pick-up hands 523 and 524 take out processed wafers from the process chamber 610, 620, 630, 640, 650, and 660 that have completed processes and then load the processed wafers to the buffer unit 300. The unload pick-up hands 523 and 524 are spaced the first gap D1. Thus, the unload pick-up hands 523 and 524 can simultaneously load the processed wafers taken out from the process chambers 610, 620, 630, 640, 650, and 660, to the buffer unit 300.

In this embodiment, the number of the load pick-up hands 521 and 522 and the number of the unload pick-up hands 523 and 524 are two, respectively, but the numbers may be increased according to the process efficiency of the substrate-processing system 1000.

For example, the number of the supports in each of the unit groups in the buffer unit 300, and the maximum number of the index arms 220 in the index robot 200, taking out or loading wafers from or to the buffer unit 300 at a time, and the maximum number of the pick-up hands 521, 522, 523, and 524 in the main transfer robot 500, taking out or loading wafers from or to the buffer unit 300 at a time are the same.

As such, the main transfer robot 500 takes out a plurality of primitive wafers or one primitive wafer at a time from the buffer unit 300. Also, the main transfer robot 500 loads a plurality of processed wafers or one processed wafer into the buffer unit 300 at a time. Accordingly, since the main transfer robot 500 reduces a transfer time of wafers, the substrate-processing system 1000 can reduce the process time and improve the productivity.

The rotation part 540 is disposed under the hand-driving part 510. The rotation part 540 is coupled to the hand-driving part 510 and rotates to rotate the hand-driving part 510. Accordingly, the pick-up hands 521, 522, 523, and 524 rotate together.

Although not shown, a vertical movement part is disposed under the rotation part 540, and a horizontal movement part is disposed under the vertical movement part. The vertical movement part is coupled to the rotation part 540 and moves the rotation part 540 upward and downward, so as to adjust vertical positions of the hand-driving part 510 and the pick-up hand part 520. The horizontal movement part is coupled to the second transfer rail 30 and moves along the second transfer rail 30. Accordingly, the main transfer robot 500 moves between the buffer unit 300 and the process chambers 610, 620, 630, 640, 650, and 660.

When processes are finished simultaneously or almost simultaneously in the process chambers 610, 620, 630, 640, 650, and 660, the main transfer robot 500 unloads processed wafers from the respective process chambers 610, 620, 630, 640, 650, and 660. The main transfer robot 500 having the unloaded wafers moves to the buffer unit 300 and loads the wafers on the buffer unit 300.

For example, when processes are finished in two of the process chambers 610, 620, 630, 640, 650, and 660, the main transfer robot 500 unloads two primitive wafers from the buffer unit 300, and then moves to one selected from the two of the chambers 610, 620, 630, 640, 650, and 660. The main transfer robot 500 takes out a processed wafer from the selected one, and then provides one of the two primitive wafers unloaded from the buffer unit 300 to the selected one of the chambers 610, 620, 630, 640, 650, and 660. The main transfer robot 500 has one processed wafer and one primitive wafer and moves to the other one of the chambers 610, 620, 630, 640, 650, and 660. The main transfer robot 500 takes out a processed wafer from the other one and then provides the remaining primitive wafer to the other one. Then, the main transfer robot 500 moves to the buffer unit 300 and loads the two processed wafers to the buffer unit 300.

As such, the main transfer robot 500 takes out primitive wafers from some of the process chambers 610, 620, 630, 640, 650, and 660, where processes are finished, and then transfers the primitive wafers at a time to the buffer unit 300. Accordingly, a number of times during which the main transfer robot 500 transfers wafers is decreased, thereby reducing the process time of the substrate-processing system 1000 and improving the productivity.

Both sides of the transfer passage 400 where the main transfer robot 500 is disposed are provided with the respective process chambers 610, 620, 630, 640, 650, and 660 processing primitive wafers and forming processed wafers. Processes performed in the process chambers 610, 620, 630, 640, 650, and 660 include a cleaning process for cleaning primitive wafers. Each two of the process chambers 610, 620, 630, 640, 650, and 660 face each other and the transfer passage 400 is disposed between the two process chambers 600. The three process chambers 600 are disposed on each of the both sides of the transfer passage 400.

Although the substrate-processing system 1000 includes the six process chambers 610, 620, 630, 640, 650, and 660 in this embodiment, the number of the process chambers 610, 620, 630, 640, 650, and 660 may be increased or decreased according to the process efficiency and the footprint conditions of the substrate-processing system 1000. Also, although the process chambers 610, 620, 630, 640, 650, and 660 are disposed in a single layer structure in this embodiment, twelve process chambers may be classified into two six-process-chamber groups in a multi-layer structure.

The main transfer robot 500 is connected to the control unit 700. When the processed wafers are unloaded from the process chambers 610, 620, 630, 640, 650, and 660, the control unit 700 controls a traffic line and an unloading order of the main transfer robot 500. That is, the control unit 700 operates such that primitive wafers that have been processed in current one of the process chambers 610, 620, 630, 640, 650, and 660 are taken out according to the order in which the primitive wafers are originally loaded in the FOUPs 120a, 120b, 120c, and 120d.

For example, when the FOUPs 120a, 120b, 120c, and 120d have twenty five slots, and the first slot is disposed in the lowest portion, and the first through twenty-fifth slots are sequentially disposed, a primitive wafer disposed at the twenty-fifth slot is first loaded to the process chambers 610, 620, 630, 640, 650, and 660. The control unit 700 stores slot numbers of wafers loaded in correspondence with the process chambers 610, 620, 630, 640, 650, and 660, and detects the slot numbers of processed wafers completed in the current one of the process chambers 610, 620, 630, 640, 650, and 660, so as to generate a wafer list. The control unit 700 controls the main transfer robot 500 to take out the processed wafers according to the order from the oldest one of the processed wafers, i.e., from the processed wafer having the greatest slot number to the processed wafer having the smallest slot number, with reference to the wafer list.

Hereinafter, a process where the index robot 200 and the main transfer robot 500 transfer a plurality of wafers will now be described in detail with reference to the accompanying drawings.

Figure 6:
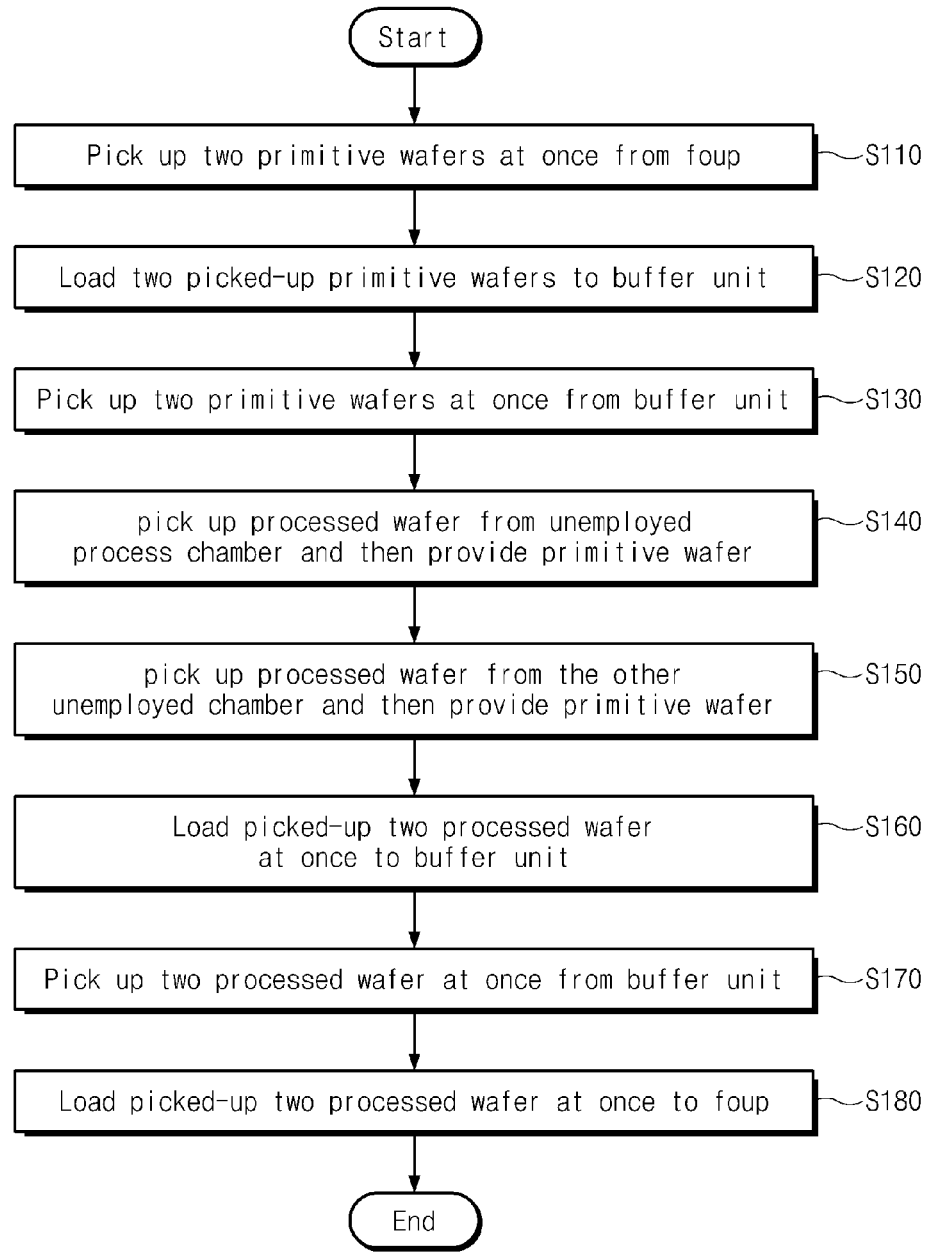
FIG. 6 is a flowchart illustrating a process where the main transfer robot illustrated in FIG. 1 transfers wafers.
Figure 7:
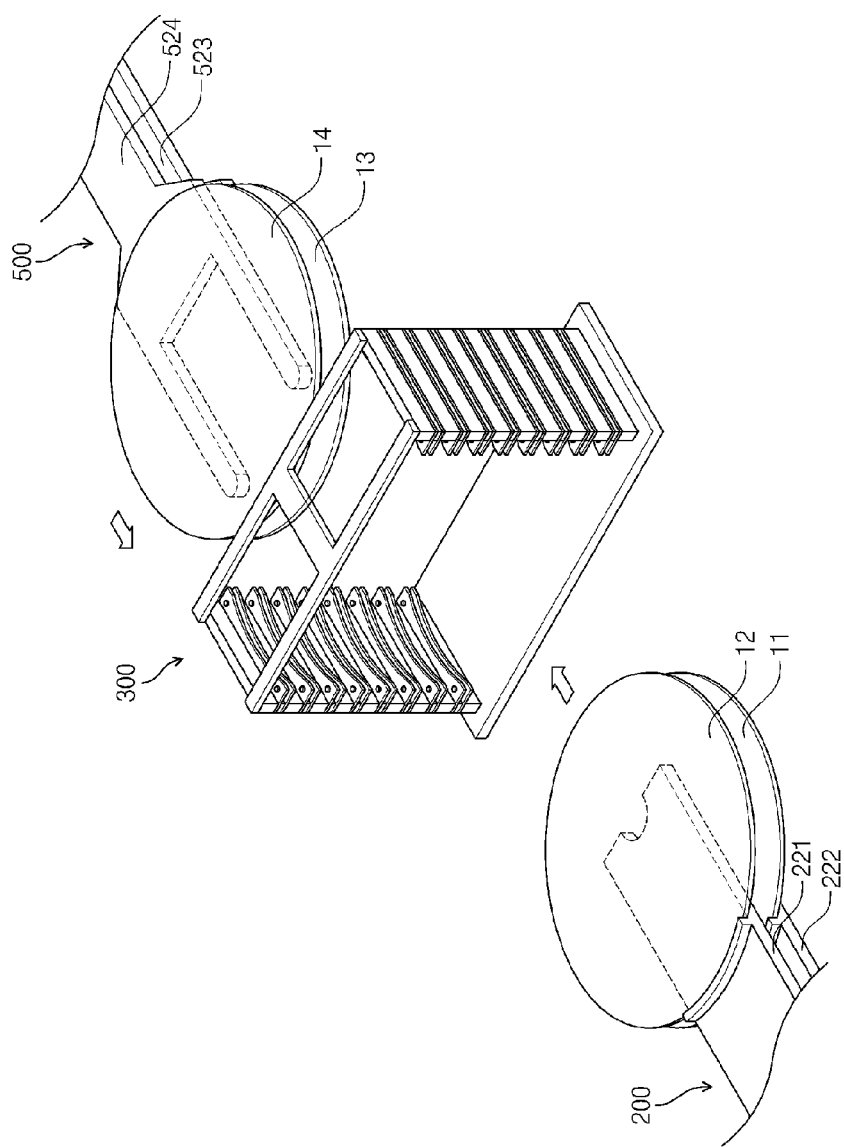
FIG. 7 is a schematic view illustrating a process of loading wafers to the buffer unit illustrated in FIG. 2.
Figure 8:
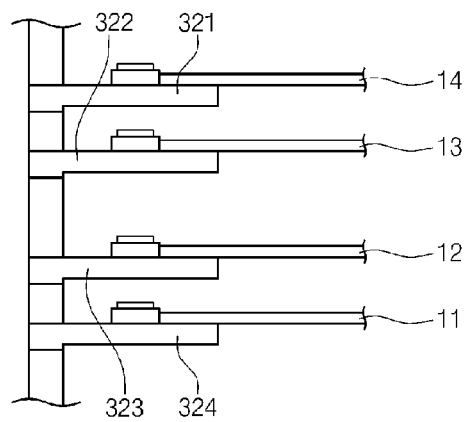
FIG. 8 is a partial schematic view illustrating wafers placed on the buffer unit illustrated in FIG. 7.

FIG. 6 is a flowchart illustrating a process of transferring a plurality of wafers in the substrate-processing system 1000 illustrated in FIG. 1. FIG. 7 is a schematic view illustrating a process of loading wafers to the buffer unit 300 illustrated in FIG. 2. FIG. 8 is a partial schematic view illustrating wafers placed on the buffer unit 300 illustrated in FIG. 7.

Referring to FIGS. 1, 6 and 7, in operation S110, the index robot 200 moves to selected one from the FOUPs 120a, 120b, 120c, and 120d placed on the loading/unloading unit 110, and first and second index arms 221 and 222 of the index arms 220 are inserted into the selected one and pick up primitive wafers 11 and 12. Accordingly, the primitive wafers 11 and 12 are loaded on the first and second index arms 221 and 222, respectively, so that the index robot 200 picks up the two primitive wafers 11 and 12 at a time from the selected one from the FOUPs 120a, 120b, 120c, and 120d.

In operation S120, the index robot 200 moves to the buffer unit 300, and the first and second index arms 221 and 222 are inserted into the buffer unit 300 to simultaneously load the primitive wafers 11 and 12 to the buffer unit 300. At this point, the index robot 200 loads the primitive wafers 11 and 12 to two of the supports of the buffer unit 300, spaced the first distance D1. For example, referring to FIG. 8, the first index arm 221 loads the primitive wafer 12 on the third support 323 of the first and second support parts 320 and 330, and simultaneously, the second index arm 222 loads the primitive wafer 11 on the fourth support 324 disposed just below the third support 323.

Figure 9:
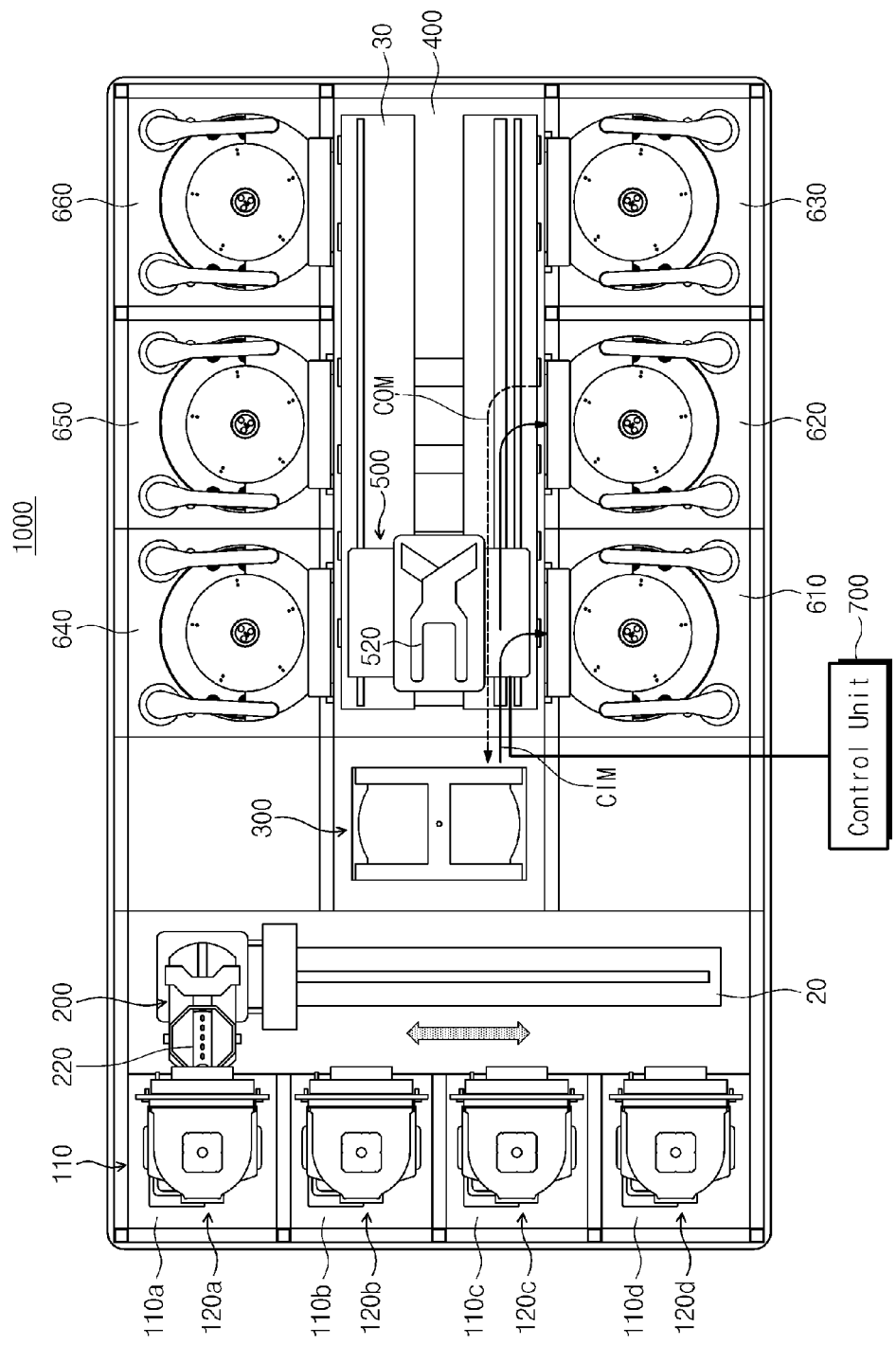
FIG. 9 is a schematic view illustrating traffic lines along which the main transfer robot illustrated in FIG. 7 transfers a wafer.

FIG. 9 is a schematic view illustrating traffic lines along which the main transfer robot 500 illustrated in FIG. 7 transfers a wafer.

Referring to FIGS. 6 and 9, when the processes are simultaneously or almost simultaneously finished in at least two of the process chambers 610, 620, 630, 640, 650, and 660, the main transfer robot 500 moves to the buffer unit 300. In operation S130, the load pick-up hands 521 and 522 (refer to FIG. 5) of the main transfer robot 500 are inserted into the buffer unit 300 to simultaneously pick up the primitive wafers 11 and 12. Accordingly, the primitive wafers 11 and 12 are loaded on the pick-up hands 521 and 522, respectively, so that the main transfer robot 500 picks up the two primitive wafers 11 and 12 at a time.

In operation S140, the main transfer robot 500 moves to selected one from the two of the process chambers 610, 620, 630, 640, 650, and 660, that is, from unemployed two of the process chambers 610, 620, 630, 640, 650, and 660, and then takes out a processed wafer from the selected one and provides one of the primitive wafers 11 and 12 to the selected one. In operation S150, the main transfer robot 500 moves to the other one of the unemployed two, and then takes out a processed wafer from the other one of the unemployed two, and provides the other one of the primitive wafers 11 and 12 to the other one of the unemployed two. Accordingly, the processed wafers are placed on the two unload pick-up hands 523 and 524, respectively.

In operation S160, the main transfer robot 500 transfers the picked-up two processed wafers to the buffer unit 300, and loads the picked-up two processed wafers at a time to the buffer unit 300.

For example, if the processes are simultaneously finished at the adjacent first and second process chambers 610 and 620, the main transfer robot 500 takes out two primitive wafers from the buffer unit 300. Then, the main transfer robot 500 moves to the first process chamber 610, and takes out a processed wafer from the first process chamber 610, and then loads one primitive wafer to the first process chamber 610. Then, the main transfer robot 500 moves to the second process chamber 620 from the first process chamber 610 with a load of the processed wafer taken out from the first process chamber 610. Then, the main transfer robot 500 takes out a processed wafer from the second process chamber 620, and then loads the remaining primitive wafer to the second process chamber 620. Accordingly, the two processed wafers are loaded on the main transfer robot 500. The main transfer robot 500 transfers the processed wafers, taken out from the first process chamber 610 and the second process chamber 620, to the buffer unit 300.

In FIG. 9, a reference character CIM denotes the traffic line along which the main transfer robot 500 loads primitive wafers respectively to the first process chamber 610 and the second process chamber 620, and takes out processed wafers respectively from them, and a reference character COM denotes the traffic line along which the main transfer robot 500 transfers processed wafers taken out from the first process chamber 610 and the second process chamber 620 to the buffer unit 300.

Referring to FIGS. 6 and 7, the main transfer robot 500 loads processed wafers 13 and 14 placed on the unload pick-up hands 523 and 524, to the buffer unit 300 at a time. That is, the unload pick-up hands 523 and 524 are inserted into the buffer unit 300 to simultaneously load the processed wafers 13 and 14 to the buffer unit 300. For example, as illustrated in FIG. 8, the unload pick-up hands 523 and 524 load the processed wafers 13 and 14 on the two supports spaced the first distance D1, e.g., on the second support 322 and the first support 321, respectively.

When wafers are loaded and taken out to and from the buffer unit 300, the index robot 200 and the main transfer robot 500 can simultaneously access to the buffer unit 300. The adjacent two unit groups of the supports in the buffer unit 300 are spaced the second distance D2 wider than the first distance D1, thereby providing an enough space for the index robot 200 and the main transfer robot 500 to operate in the buffer unit 300. This prevents the index robot 200 loading or unloading a substrate to or from the buffer unit 300 from interfering with the main transfer robot 500 loading or unloading a substrate to or from the buffer unit 300.

In the buffer unit 300, the primitive wafers 11 and 12 are separated from the processed wafers 13 and 14. That is, as illustrated in FIG. 8, it is determined whether the processed wafers 13 and 14 are loaded on the two supports spaced the first distance D1, i.e., on the unit group of the buffer unit 300, or the primitive wafers 11 and 12 are loaded on the two supports spaced the first distance D1, i.e., on the unit group of the buffer unit 300. At this point, the processed wafers 13 and 14 are loaded on any one of the adjacent unit groups, and the primitive wafers 11 and 12 are loaded on the other one.

Unlike this, the all supports of the first support part 320 and the second support part 330 may be divided into upper and lower portions, so that the processed wafers 13 and 14 are loaded on some of the supports in the upper portion, and the primitive wafers 11 and 12 are loaded on some of the supports in the lower portion. For example, when the number of supports provided to each of the first support part 320 and the second support parts 330 is sixteen, the processed wafers 13 and 14 may be loaded on some of the eight supports disposed in an upper portion, the primitive wafers 11 and 12 may be loaded on some of the eight supports disposed in a lower portion.

After the operation S160, in operation S170, the index robot 200 moves to the buffer unit 300, and the two of index arms 221, 222, 223 and 224 are inserted into the buffer unit 300 to simultaneously pick up the two processed wafers 13 and 14 from the buffer unit 300. Then, the index robot 200 moves with a load of the two processed wafer 13 and 14 to corresponding one from the FOUPs 120*a*, 120*b*, 120*c*, and 120*d*.

In operation S180, the index robot 200 loads the two processed wafers 13 and 14 into the corresponding FOUP at once.

Hereinafter, an order in which the main transfer robot 500 takes out processed wafers from a plurality of process chambers where processes are finished, will now be described in detail with reference to the accompanying drawings, and a case where the main transfer robot 500 includes three unload pick-up hands will now be exemplified.

Figure 10:
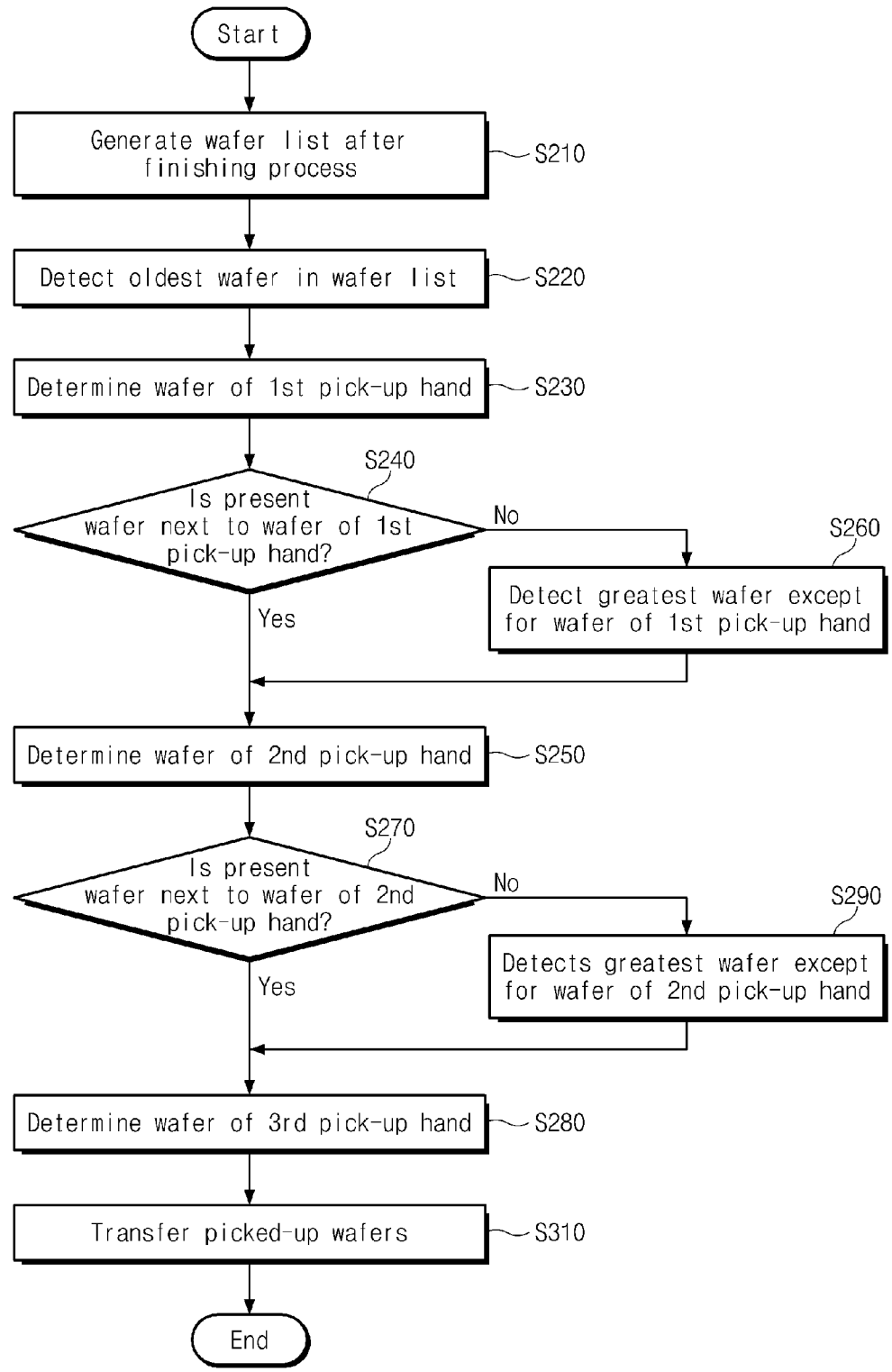
FIG. 10 is a flowchart illustrating a process where the main transfer robot illustrated in FIG. 1 takes out wafers from the process chambers.

FIG. 10 is a flowchart illustrating a process where the main transfer robot 500 illustrated in FIG. 1 takes out wafers from the process chambers.

Referring to FIGS. 1, 5 and 10, in operation S210, the control unit 700 detects slot numbers of the respective processed wafers disposed in the process chambers where the processes are finished, so as to generate a wafer list.

In operation S220, the control unit 700 detects the oldest processed wafer, i.e., the processed wafer having the greatest slot number, in the wafer list.

In operation S230, the detected processed wafer is set as a processed wafer that the first unload pick-up hands 524 of the main transfer robot 500 picks up, and the first unload pick-up hands 524 of the main transfer robot 500 picks up the selected processed wafer from the corresponding process chamber.

In operation S240, the control unit 700 determines whether the processed wafer following the processed wafer of the first unload pick-up hand 524 in the wafer list, that is, the processed wafer next to the processed wafer of the first unload pick-up hand 524 in the order of the slot numbers is present or not.

When it is determined in operation S240 that the processed wafer following the processed wafer of the first unload pick-up hand 524 is present, the processed wafer following the processed wafer of the first unload pick-up hand 524 is set as the processed wafer of the second pick-up hand 523 disposed just below the first unload pick-up hand 524, and then the second pick-up hand 523 picks up the set processed wafer from the corresponding process chamber, in operation S250.

When it is determined in operation S240 that the processed wafer following the processed wafer of the first unload pick-up hand 524 is not present, the processed wafer having the greatest slot number in the wafer list, except for the processed wafer of the first unload pick-up hand 524 is set as the processed wafer of the second pick-up hand 523, and the second pick-up hand 523 picks up the set processed wafer from the corresponding process chamber, in operation S260.

Although the main transfer robot 500 includes the two unload pick-up hands 523 and 524 and the two load pick-up hands 521 and 522 in FIG. 5, the main transfer robot 500 may include three unload pick-up hands and three load pick-up hands.

When the main transfer robot 500 includes the three unload pick-up hands, in operation S270, the control unit 700 determines whether the processed wafer following the processed wafer of the second pick-up hand 523 in the wafer list, that is, the processed wafer next to the processed wafer of the second pick-up hand 523 in the order of the slot numbers is present or not.

When it is determined in operation S270 that the processed wafer following the processed wafer of the second unload pick-up hand 523 is present, the processed wafer following the processed wafer of the second unload pick-up hand 523 is set as the processed wafer of the third pick-up hand (not shown) disposed just below the second unload pick-up hand 523, and then the third pick-up hand picks up the set processed wafer from the corresponding process chamber, in operation S280.

When it is determined in operation S270 that the processed wafer following the processed wafer of the second unload pick-up hand 523 is not present, the processed wafer having the greatest slot number in the wafer list, except for the processed wafer of the second unload pick-up hand 523 is set as the processed wafer of the third pick-up hand, and the third pick-up hand picks up the set processed wafer from the corresponding process chamber in operation S290.

In operation S310, the main transfer robot 500 transfers the processed wafer placed on the first through third pick-up hands to the buffer unit 300, and sequentially loads the processed wafers on the buffer unit 300.

As such, when taking out the wafers processed in the process chambers, the main transfer robot 500 sequentially takes out the processed wafers according to the slot numbers of the processed wafers. Accordingly, the main transfer robot 500 loads the processed wafers on the buffer unit 300 in the order of the slot numbers, so that the index robot 200 loads the processed wafers to a corresponding FOUP at a time. Thus, the substrate-processing system 1000 efficiently transfers wafers, and reduces time required for transferring wafers, and improves the productivity.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

The invention claimed is:

1. A substrate-processing apparatus comprising:
   a plurality of process chambers, a substrate being processed in each of the process chambers;

a buffer unit including a plurality of groups of supports, each support supporting a substrate to be loaded and processed in the plurality of process chambers; and a transfer member including first and second groups of horizontally movable pick-up hands, each substrate being respectively placed on the first and second groups of horizontally movable pick-up hands, the transfer member transferring a substrate between the plurality of process chambers and the buffer unit, wherein the supports in each group are vertically apart from each other at a first distance and horizontally movable pick-up hands in each of the first and second groups are vertically apart from each other at the first distance, wherein each group of the plurality of groups of supports is vertically apart from each other at a second distance and the first group is vertically apart from the second group at the second distance, wherein substrates in a same group of the buffer unit are removed by the second group at once, and wherein, when at least two of the plurality of process chambers finish processing substrates simultaneously, the first group of horizontally movable pick-up hands removes the simultaneously finished substrates from the plurality of process chambers and transfers the simultaneously finished substrates to the buffer unit at once.

2. The substrate-processing apparatus of claim 1, wherein the transfer member picks up one or more process-waiting substrates from the buffer unit at a time and loads one or more processed substrates to the buffer unit at a time.

3. The substrate-processing apparatus of claim 1, wherein the buffer unit comprises a main body having at least one open side wall for accessing with the plurality of substrates and providing a space for storing the plurality of substrates, and the plurality of groups of supports are disposed respectively on two inside walls facing each other in the main body.

4. The substrate-processing apparatus of claim 1, further comprising:

a storage container including a plurality of groups of supports, each support supporting process-waiting substrates or processed substrates; and an index robot including first and second groups of index arms, removing the process-waiting substrates from the storage container to load the process-waiting substrates to the buffer unit, and removing the processed substrates from the buffer unit to load the processed substrates to the storage container.

5. The substrate-processing apparatus of claim 4, wherein a substrate is placed on each of the first and second groups of index arms, each index arm is spaced apart from each other in the vertical direction to face each other, and each index arm in the first and second groups is spaced apart from one or more adjacent ones at the first distance.

6. The substrate-processing apparatus of claim 4, wherein the second distance provides a sufficient space for the index robot and the transfer member to move without collision.

7. The substrate-processing apparatus of claim 4, wherein each group of the plurality of groups of supports of the storage container is vertically apart from each other at the second distance and the first group of the index arm is vertically apart from the second group of the index arm at the second distance.

8. The substrate-processing apparatus of claim 1, wherein the second group of the transfer member unloads substrates from the buffer unit to the plurality of process chambers.

9. The substrate-processing apparatus of claim 1, wherein the first group is disposed vertically over the second group.

10. The substrate-processing apparatus of claim 1, wherein the second distance is wider than the first distance.

11. The substrate-processing apparatus of claim 1, wherein the first distance is about 10 millimeters and the second distance is about 20 millimeters.

12. The substrate-processing apparatus of claim 1, wherein a number of supports in each group is equal to a number of movable pick-up hands in the first group or the second group.

13. A method of transferring a substrate, the method comprising:

removing substrates to be processed from a buffer unit, which includes a plurality of groups of supports, by a transfer member, which includes first and second groups of horizontally movable pick-up hands, to provide the substrate to a plurality of process chambers where the substrate is processed;

removing the processed substrate from the process chamber by the transfer member; and transferring the processed substrate to the buffer unit by the transfer member, wherein the supports in each group are vertically apart from each other at a first distance and horizontally movable pick-up hands in each of the first and second groups are vertically apart from each other at the first distance, wherein each group of the plurality of groups of supports is vertically apart from each other at a second distance and the first group is vertically apart from the second group at the second distance, wherein the substrates are removed from a same group of the buffer unit by the second group of horizontally movable pick-up hands at once, and wherein, when at least two of the plurality of process chambers finish processing substrates simultaneously, the simultaneously processed substrates are removed from the plurality of process chambers and are transferred to the buffer unit at once by the first group of horizontally movable pick-up hands of the transfer member.

14. The method of claim 13, wherein the transfer member loads at least one of the processed substrates into the buffer unit at a time.

15. The method of claim 13, further comprising:

removing, by an index robot, the substrate to be processed from a storage container to load the substrate to be processed in the buffer unit; and removing, by the index robot, the processed substrate from the buffer unit to load the processed substrate in the storage container, wherein the index robot loads at least one substrate to be processed in the buffer unit at a time.

16. The method of claim 15, wherein the index robot removes at least one of the processed substrates from the buffer unit at a time.

* * * * *